(12) United States Patent
Hori et al.

(10) Patent No.: US 10,867,980 B2
(45) Date of Patent: Dec. 15, 2020

(54) SEMICONDUCTOR EQUIPMENT

(71) Applicant: FUJI ELECTRIC CO., LTD., Kawasaki (JP)

(72) Inventors: Motohito Hori, Matsumoto (JP); Yoshinari Ikeda, Matsumoto (JP); Akira Hirao, Matsumoto (JP); Mai Saitou, Matsumoto (JP); Ryoichi Kato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/590,070

(22) Filed: Oct. 1, 2019

(65) Prior Publication Data
US 2020/0118986 A1 Apr. 16, 2020

(30) Foreign Application Priority Data
Oct. 15, 2018 (JP) .................. 2018-194610

(51) Int. Cl.
*H01L 23/42* (2006.01)
*H01L 25/16* (2006.01)
*H01L 23/427* (2006.01)
*H01L 23/50* (2006.01)
*H01L 23/31* (2006.01)

(52) U.S. Cl.
CPC .......... *H01L 25/16* (2013.01); *H01L 23/3114* (2013.01); *H01L 23/42* (2013.01); *H01L 23/427* (2013.01); *H01L 23/50* (2013.01)

(58) Field of Classification Search
CPC ....... H01L 25/16; H01L 23/42; H01L 23/427; H01L 23/50; H01L 23/3114
See application file for complete search history.

(56) References Cited

U.S. PATENT DOCUMENTS

| 2008/0112201 A1 | 5/2008 | Yahata et al. |
| 2012/0236500 A1 | 9/2012 | Higuchi et al. |
| 2017/0162466 A1 | 6/2017 | Sawada |

(Continued)

FOREIGN PATENT DOCUMENTS

| JP | 2001145366 A | 5/2001 |
| JP | 2002315358 A | 10/2002 |

(Continued)

*Primary Examiner* — Douglas M Menz
(74) *Attorney, Agent, or Firm* — Rabin & Berdo, P.C.

(57) ABSTRACT

Semiconductor equipment includes semiconductor modules sealed with a resin, each having first and second connection terminals exposed from the resin, a capacitor including third and fourth connection terminals, a cooler directly contacting the semiconductor modules and the capacitor, a busbar including a first busbar connecting the first connection terminal to the third connection terminal, a second busbar connecting the second connection terminal to the fourth connection terminal, and a first insulating layer sandwiched by the first and second busbars, main surfaces of the first and second busbars being parallel to each other, a control circuit board configured to control the semiconductor modules, and a heat transfer component including a main body connected to the cooler, and a second insulating layer arranged on the main body, the main body being in contact with the busbar and the control circuit via the second insulating layer.

10 Claims, 8 Drawing Sheets

(56) References Cited

U.S. PATENT DOCUMENTS

| | | | | |
|---|---|---|---|---|
| 2017/0338734 A1* | 11/2017 | Nakashima | ........... | H02M 7/003 |
| 2017/0341638 A1 | 11/2017 | Sawada | | |
| 2018/0083548 A1* | 3/2018 | Hagimoto | ........... | H01L 21/4878 |
| 2020/0051892 A1* | 2/2020 | Gohara | .................. | H02K 11/33 |

FOREIGN PATENT DOCUMENTS

| | | | |
|---|---|---|---|
| JP | 2003124413 | A | 4/2003 |
| JP | 2004282804 | A | 10/2004 |
| JP | 2007159204 | A | 6/2007 |
| JP | 2008125240 | A | 5/2008 |
| JP | 2015100223 | A | 5/2015 |
| JP | 2016035945 | A | 3/2016 |
| JP | 201615/1412 | A | 8/2016 |
| JP | 2017103380 | A | 6/2017 |
| JP | 2017212286 | A | 11/2017 |
| WO | 2010147199 | A1 | 12/2010 |
| WO | 2013031147 | A1 | 3/2013 |
| WO | 2013046675 | A1 | 4/2013 |
| WO | 2013118222 | A1 | 8/2013 |
| WO | 2013145508 | A1 | 10/2013 |
| WO | 2014020806 | A1 | 2/2014 |

* cited by examiner

A-A CROSS SECTION

B-B CROSS SECTION

C-C CROSS SECTION

SEMICONDUCTOR EQUIPMENT

CROSS REFERENCE TO RELATED APPLICATION

This application is based upon and claims the benefit of priority from the prior Japanese Patent Application No. 2018-194610, filed on Oct. 15, 2018; the entire contents of which are incorporated herein by reference.

BACKGROUND OF THE INVENTION

Field of the Invention

The present invention relates to semiconductor equipment.

Description of the Related Art

Semiconductor equipment has a substrate equipped with a semiconductor element such as an insulated gate bipolar transistor (IGBT), a power metal oxide semiconductor field effect transistor (power MOSFET), a free wheeling diode (FWD). They are used as inverters etc. (see, for example, Patent Documents 1 through 7).

This type of semiconductor equipment employs a cooling mechanism in some form to reduce influence of heat that the semiconductor element may have depending on factors such as the use environment. Patent Document 1 for example describes a semiconductor module having heat dissipation fins equipped with a cooling-water channel for the purpose of cooling. Patent Document 2 describes a configuration in which a heat absorption plate is provided between the substrate and the module, and the heat absorption plate is connected at its one end to cooling fins. Patent Documents 3 through 14 describe a heat pipe, heat dissipation fins, a heat transfer plate, a heat insulation sheet, etc. that are set at a portion where heat is generated.

PRIOR ART DOCUMENTS

Patent Documents

[Patent Document 1] Japanese Laid-open Patent Publication No. 2008-125240
[Patent Document 2] Japanese Laid-open Patent Publication No. 2001-145366
[Patent Document 3] International Publication Pamphlet No. 2010/147199
[Patent Document 4] Japanese Laid-open Patent Publication No. 2003-124413
[Patent Document 5] Japanese Laid-open Patent Publication No. 2017-212286
[Patent Document 6] Japanese Laid-open Patent Publication No. 2017-103380
[Patent Document 7] Japanese Laid-open Patent Publication No. 2016-35945
[Patent Document 8] Japanese Laid-open Patent Publication No. 2004-282804
[Patent Document 9] Japanese Laid-open Patent Publication No. 2007-159204
[Patent Document 10] International Publication Pamphlet No. 2013/031147
[Patent Document 11] International Publication Pamphlet No. 2013/046675
[Patent Document 12] International Publication Pamphlet No. 2013/118222
[Patent Document 13] International Publication Pamphlet No. 2013/145508
[Patent Document 14] International Publication Pamphlet No. 2014/020806
[Patent Document 15] Japanese Laid-open Patent Publication No. 2015-100223
[Patent Document 16] Japanese Laid-open Patent Publication No. 2002-315358
[Patent Document 17] Japanese Laid-open Patent Publication No. 2016-154442

Further, a current-smoothing capacitor embedded in a module often suffers from relatively low heat resistance, requiring even higher cooling efficiency. Consideration should also be given to influence of noise that the capacitor exerts on the driving circuit.

SUMMARY

In view of the above issues, it is an object of the present invention to provide semiconductor equipment that can improve the coolability as well as suppress influence of noise.

The semiconductor equipment according to one aspect of the present invention is semiconductor equipment including a plurality of semiconductor modules sealed with a resin, each semiconductor module having an upper surface and a lower surface, and including a first connection terminal and a second connection terminal that are exposed from the resin at the upper surface thereof, a capacitor including a third connection terminal and a fourth connection terminal, the capacitor having an upper surface and a lower surface, a cooler directly contacting the lower surface of each semiconductor module and the lower surface of the capacitor, a busbar including a first insulating layer having an upper surface and a lower surface, a first busbar having an upper surface and a lower surface, and being disposed on the upper surface of the first insulating layer, and a second busbar having an upper surface and a lower surface, and being disposed on the lower surface of the first insulating layer. The first busbar connects the first connection terminal to the third connection terminal, the second busbar connects the second connection terminal to the fourth connection terminal, and the upper and lower surfaces of the first busbar and the upper and lower surfaces of the second busbar are at least partially parallel to each other, a control circuit board configured to control the semiconductor modules, and a heat transfer component including a main body having an upper surface and a lower surface, and being connected to the cooler, and a second insulating layer disposed on at least a part of the lower surface of the main body so that the lower surface of the main body is in contact with the busbar via the second insulating layer, and disposed on at least a part of the upper surface of the main body so that the upper surface of the main body is in contact with the control circuit board via the second insulating layer.

The present invention can improve the coolability as well as suppress influence of noise.

DESCRIPTION OF EMBODIMENTS

Figure 1:
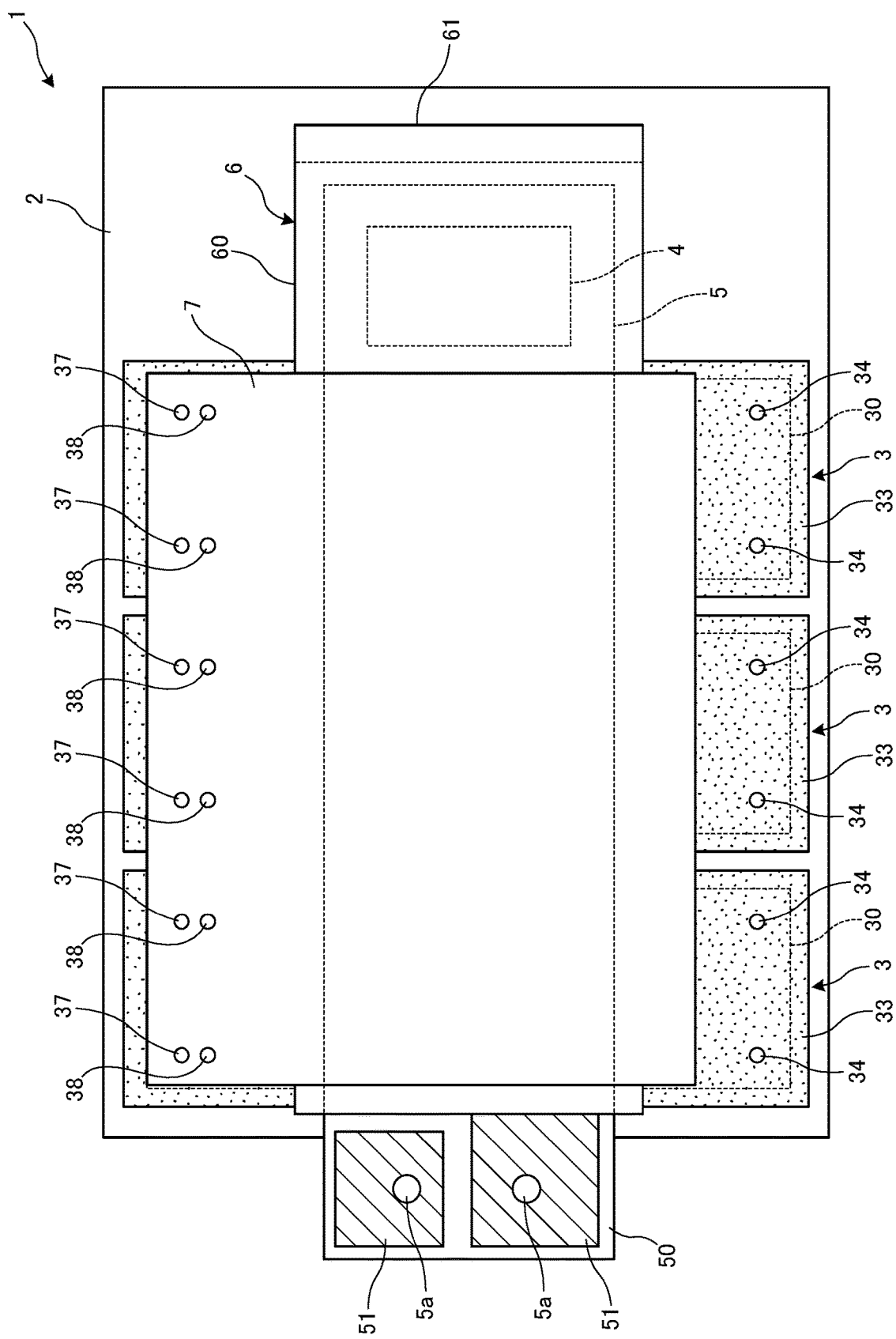
FIG. 1 is a schematic plan view illustrating an example of semiconductor equipment according to the present embodiment.
Figure 2:
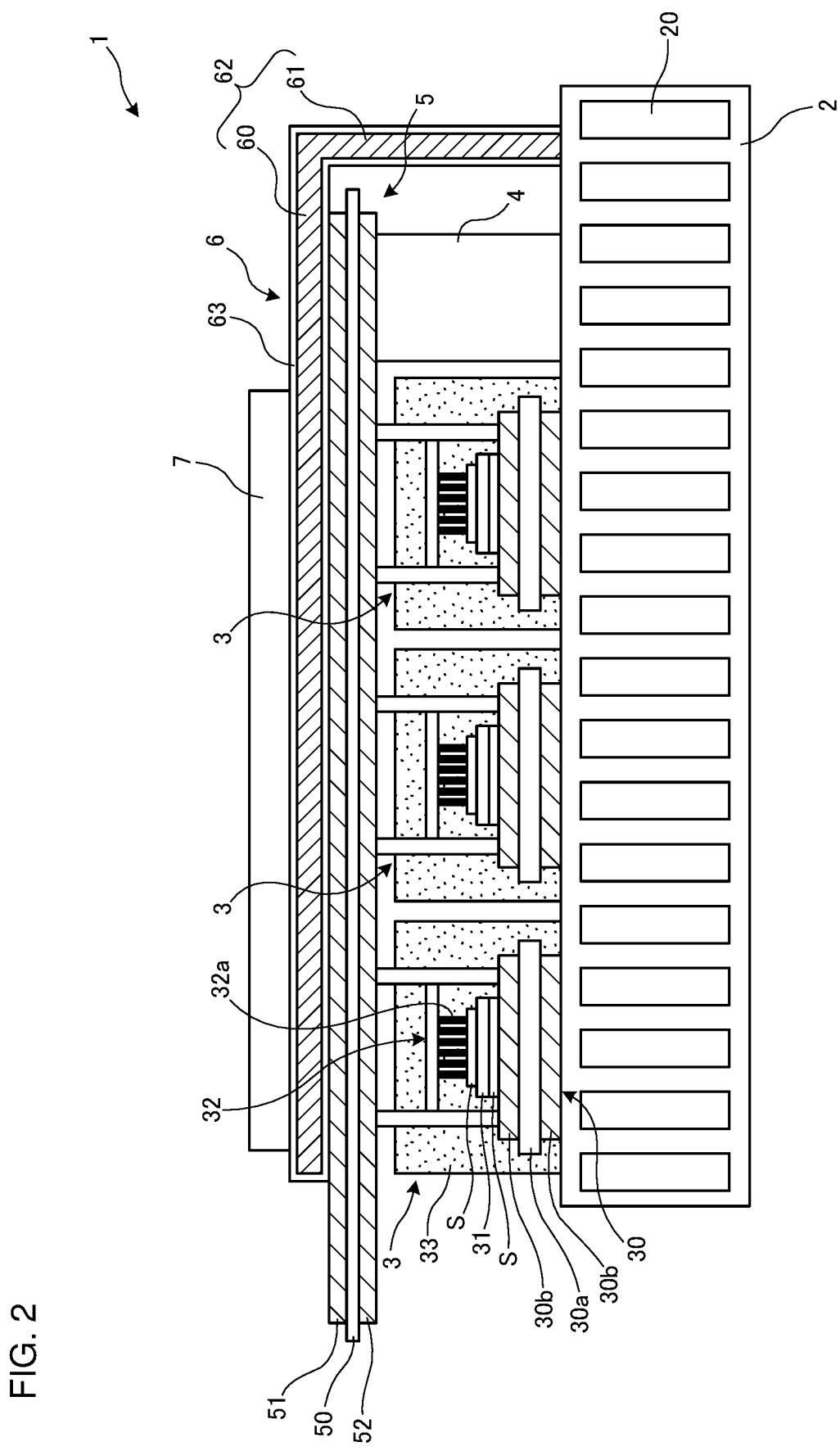
FIG. 2 is a schematic sectional view of the semiconductor equipment appearing in FIG. 1.
Figure 3A:
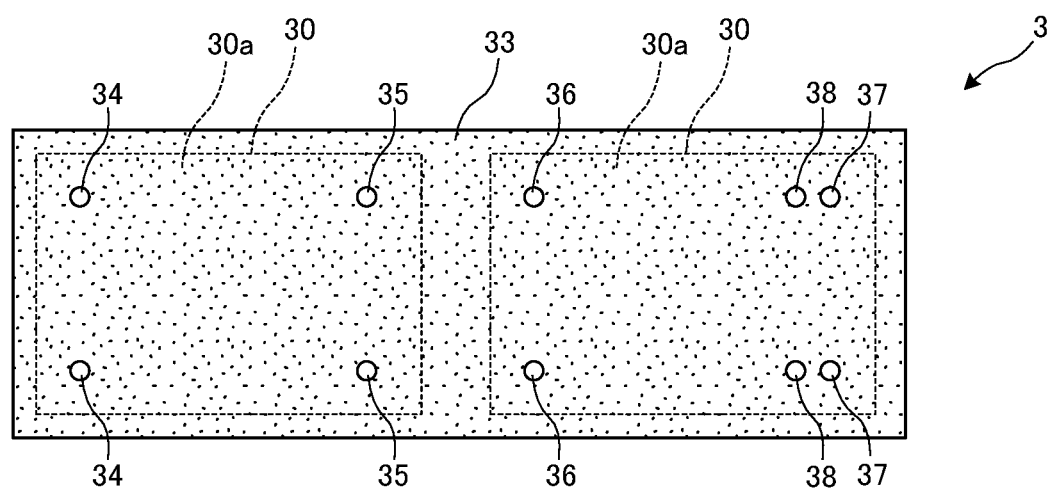
FIG. 3A and FIG. 3B are plan views illustrating one of semiconductor modules according to the present embodiment.
Figure 3B:
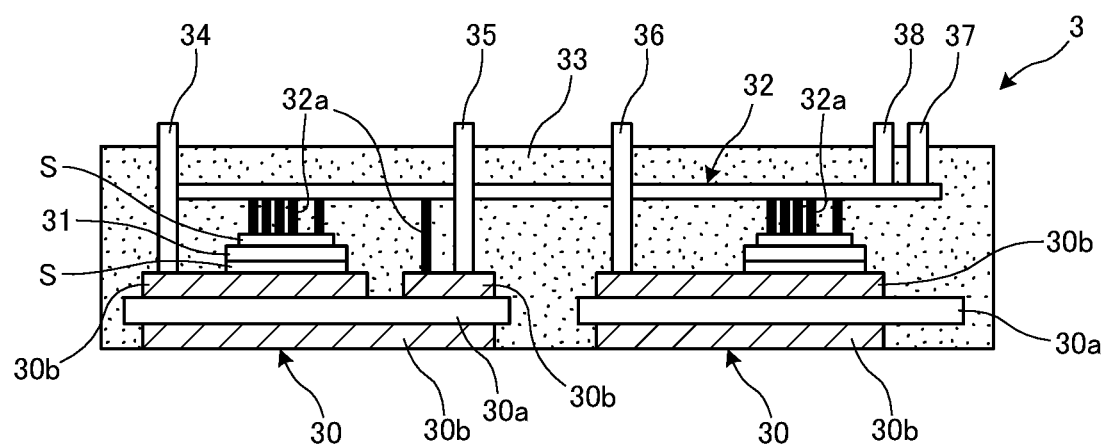

The following schematically explains a configuration of semiconductor equipment to which the present invention can be applied. FIG. 1 is a schematic plan view illustrating an example of semiconductor equipment according to the present embodiment. FIG. 2 is a schematic sectional view of the semiconductor equipment appearing in FIG. 1. FIGS. 3A and 3B are schematic views illustrating one of the semiconductor modules according to the present embodiment. FIG. 3A is a plan view illustrating the semiconductor module, and FIG. 3B is a sectional view of the semiconductor module. The semiconductor equipment explained below is just exemplary, and can receive appropriate modifications without being limited to such examples.

As illustrated in FIG. 1 and FIG. 2, semiconductor equipment 1 according to the present embodiment functions as an electric power conversion apparatus, and includes a plurality (three in the present embodiment) of semiconductor modules 3 and a capacitor 4 arranged on the upper surface of a cooler 2. Above the three semiconductor modules 3 and on the capacitor 4, there are a busbar 5, a heat transfer component 6, and a control circuit board 7 stacked in this order starting from below. The busbar 5, the heat transfer component 6, and the control circuit board 7 are rectangular in a plane vision.

The cooler 2 cools the semiconductor modules 3 and the capacitor 4, and is roughly a cuboid having a plane rectangular in a plane vision. The cooler 2 is soldered (not illustrated) to the lower surfaces of the three semiconductor modules 3 and of the capacitor 4. The cooler 2 is what is called a water-cooling cooler, in which a coolant flowing through a cooling-water channel 20 causes a thermal conversion between the coolant and the semiconductor modules 3 and capacitor 4. The cooler 2 is not limited to a water-cooling type, and may have an air-cooling structure with a plurality of fins.

As illustrated in FIG. 2 and FIGS. 3A and 3B, each of the semiconductor modules 3 employs a configuration in which semiconductor chips 31 are arranged on the upper surfaces of two insulating circuit substrates 30, and a printed circuit board 32 having pins 32a inserted to it is arranged above the semiconductor chips 31. All of these members are sealed with a resin 33 to constitute one semiconductor module 3. Each of the semiconductor modules 3 is roughly a cuboid that is long in the direction in which the two insulating circuit substrates 30 are arranged. In the present embodiment, the three semiconductor modules 3 are arranged on the upper surface of the cooler 2 in the lateral direction of each semiconductor module 3.

The insulating circuit substrates 30 include stacked metal and insulating layers. Specifically, each insulating circuit substrate 30 includes an insulating layer 30a and metal layers 30b arranged on the upper and lower surfaces of the insulating layer 30a. The insulating layer 30a includes an insulation material such as a polyimide resin etc., and the metal layer 30b includes a metal material such as copper etc.

The semiconductor chip 31 is a semiconductor substrate that is quadrate when seen from above. Examples of materials used for this semiconductor substrate include silicon (Si) and silicon carbide (SiC). The semiconductor chip 31 includes an electrode (not illustrated) formed on the upper surface. The semiconductor chip 31 is soldered (S) to the metal layer 30b.

Examples of the semiconductor chips 31 include a switching element such as an insulated gate bipolar transistor (IGBT) and a power metal oxide semiconductor field effect transistor (power MOSFET), and a diode such as a free wheeling diode (FWD). Also, elements such as a reverse conducting (RC)-IGBT, including integrated IGBT and FWD, and a reverse blocking (RB)-IGBT, having a sufficient withstand voltage against a reverse bias, may be used for the semiconductor chips 31.

Further, the upper surface of the metal layer 30b of one (left in FIG. 3A and FIG. 3B) of the insulating circuit substrates 30 includes two output terminals 34 and two emitter-side connection terminals 35 (first connection terminals). The output terminals 34 and the emitter-side connection terminals 35 extend upward. As illustrated in FIG. 3A and FIG. 3B, two output terminals 34 are arranged respectively at the two corners along the outer edge of the insulating circuit substrate 30 with respect to its longitudinal direction, and two emitter-side connection terminals 35 are arranged respectively at the two corners along the inner edge of the insulating circuit substrate 30 with respect to its longitudinal direction. The output terminals are connected to wires connecting the semiconductor chip of the upper arm and the semiconductor chip of the lower arm, thereby causing flows of output currents. The emitter-side connection terminal 35 causes a current to flow from the surface of the semiconductor chip 31 to the outside. The upper surface of the metal layer 30b of the other (right in FIG. 3A and FIG. 3B) of the insulating circuit substrates 30 includes two collector-side connection terminals 36 (second connection terminals) that extend upward. The collector-side connection terminal 36 supplies a current to the bottom surface of the semiconductor chip 31, and is arranged at each of the two corners along the inner edge of the insulating circuit substrate 30 with respect to its longitudinal direction.

The printed circuit board 32 is a circuit board on which a post electrode (not illustrate) is formed, and is a rectangle in a plane vision that extends over the two semiconductor chips 31. The lower surface of the printed circuit board 32 includes the pins 32a that extend toward the upper surfaces of the semiconductor chips 31 or the metal layer 30b of the insulating circuit substrate 30. The tips of the pins 32a are soldered (S) to the semiconductor chips 31 or the metal layer 30b. Also, above the insulating circuit substrate 30 on other side (right in FIG. 3A and FIG. 3B), the upper surface of the printed circuit board 32 includes four pins extending upward. Among the four pins, two are arranged in one lateral-directional line and remaining two are arranged in another lateral-directional line, both lines close to an edge of the printed circuit board 32. The pins in the line closer to the outer edge of the insulating circuit substrate 30 with respect to its longitudinal direction function as gate signal terminals 37 and the pins in the line farther from that edge function as emitter signal terminals 38. The gate signal terminals 37 conduct on-off control on the semiconductor chips 31, and the emitter signal terminals 38 detect emitter-side voltages.

Each of thus configured semiconductor modules 3 is entirely sealed with the resin 33 except the output terminals 34, the emitter-side connection terminals 35, the collector-side connection terminals 36, the gate signal terminals 37, and the emitter signal terminals 38, the top end portions of which remain unsealed.

The capacitor 4 is a current-smoothing capacitor, and is roughly a cuboid. The capacitor 4 is arranged beside a semiconductor module 3, and includes a third connection terminal 40 and a fourth connection terminal 41 on the upper surface (see FIG. 4 and FIGS. 5A and 5B). The third connection terminal 40 and the fourth connection terminal 41 will be described later.

The busbar 5 connects the emitter-side connection terminals 35 and the collector-side connection terminals 36, and is a flat plate having a rectangular shape in a plane vision that is long in the direction in which the three semiconductor modules 3 are arranged. The busbar 5 includes stacked metal and insulating layers. The busbar 5 includes a first insulating layer 50, a first busbar 51 arranged on the upper surface of the first insulating layer 50, and a second busbar 52 arranged on the lower surface of the first insulating layer 50. Details of this arrangement will be described later. The first busbar 51 and the second busbar 52 have their respective main surfaces (upper surface and lower surface) parallel at least partially. The first insulating layer 50 includes an insulation material such as a polyimide resin etc., and the first busbar 51 and the second busbar 52 include a metal material such as copper etc. The capacitor 4 has its upper surface in direct contact with the second busbar 52, which will be described later.

The heat transfer component 6 is a metal body containing copper or aluminum to achieve better heat transfer. The heat transfer component 6 is a flat plate that is a rectangle in a plane vision having a greater width than that of the busbar 5, and extends over the busbar 5. Specifically, the heat transfer component 6 includes a main body 62 including a flat-plate portion 60 extending over the busbar 5 and a supporting portion 61 extending toward the cooler 2 from one edge of the flat-plate portion 60 beside the capacitor 4. The main body 62 is L shaped seen from side. An insulating layer (second insulating layer 63) having a prescribed thickness is formed (disposed) entirely on the circumferential surface of the main body 62. For the purpose of insulation, an insulation sheet having an excellent thermal conductivity may be provided as the second insulating layer 63 at least between the upper surface of the busbar 5 and the lower surface of the flat-plate portion 60 of the heat transfer component 6 and between the lower surface of the control circuit board 7 and the upper surface of the flat-plate portion 60 of the heat transfer component 6. The second insulating layer 63 includes an insulation material such as a polyimide resin etc. The main body 62 (flat-plate portion 60) has its lower surface in contact with the busbar 5 (first busbar 51) via the second insulating layer 63. The main body 62 (flat-plate portion 60) has its upper surface in contact with the lower surface of the control circuit board 7 via the second insulating layer 63. The control circuit board 7 will be described later. Also, a portion of the main body 62 (lower end of the supporting portion 61) is connected to the upper surface of the cooler 2 directly or via the second insulating layer 63. A portion of the main body 62 (lower end of the supporting portion 61) may be connected to the upper surface of the cooler 2 directly as illustrated in FIG. 2. The direct connection provides better thermal conduction. Further, grounding the cooler would be able to bring the main body 62 of the heat transfer component 6 to the ground potential as well as the cooler, leading to reduced influence of electromagnetic noise from the semiconductor modules 3 on the control circuit board 7.

The control circuit board 7 controls the three semiconductor modules 3, and is a flat plate rectangular in a plane vision to extend over the three semiconductor modules 3 and partially over the busbar 5 and the heat transfer component 6. The direction in which the three semiconductor modules 3 are arranged coincides with the longitudinal direction of the control circuit board 7. The control circuit board 7 has a lateral width greater than that of each of the busbar 5 and the heat transfer component 6 so as to face the gate signal terminals 37 and the emitter signal terminals 38 of the semiconductor modules 3. The control circuit board 7 includes electrodes (not illustrated) to which the upper ends of the gate signal terminals 37 and the emitter signal terminals 38 are connected. The control circuit board 7 has its lower surface in contact with the upper surface of the heat transfer component 6 (second insulating layer 63).

Figure 4:
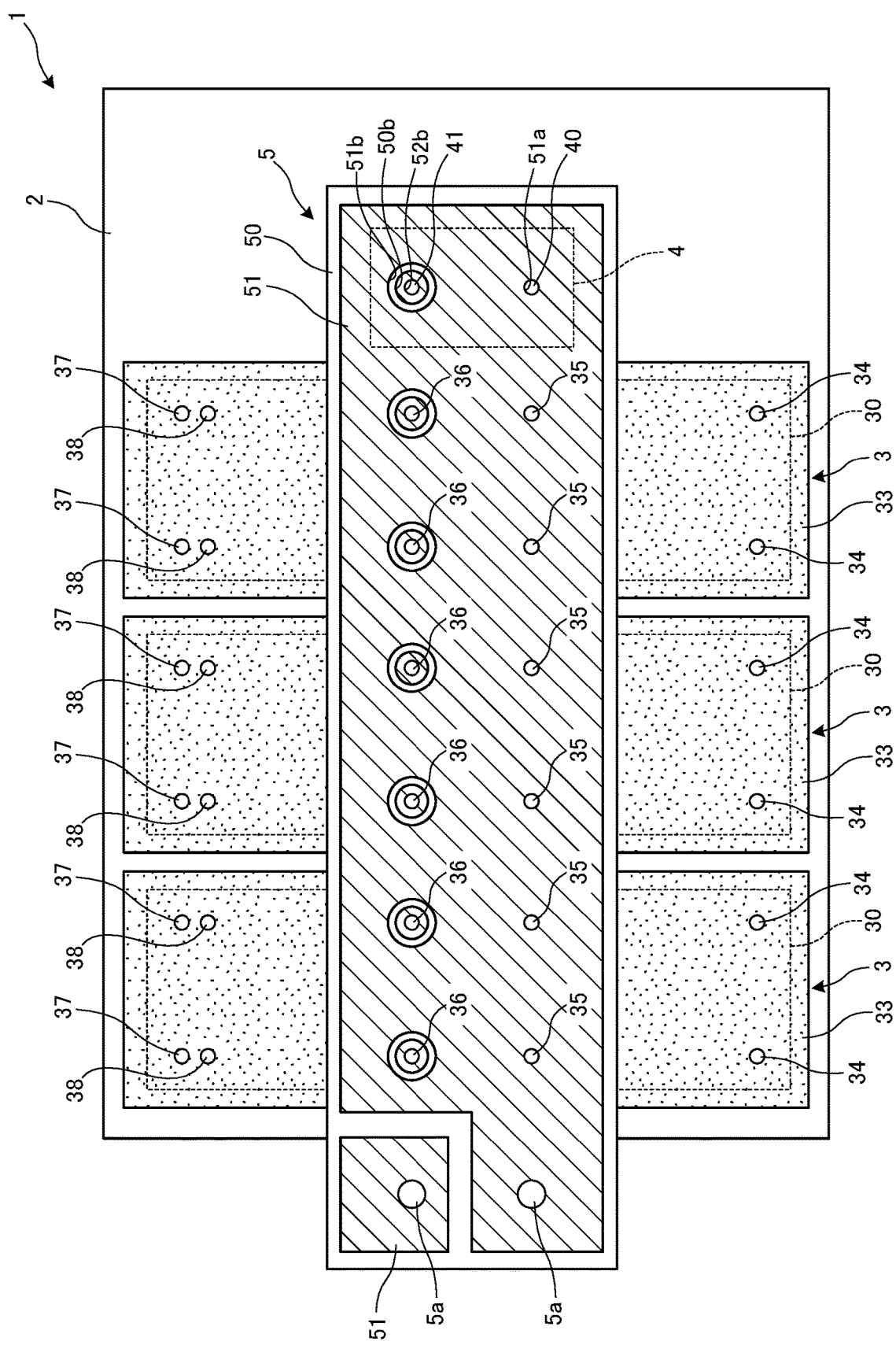
FIG. 4 illustrates the configuration of FIG. 1, omitting a control circuit board and a heat transfer component.
Figure 5A:
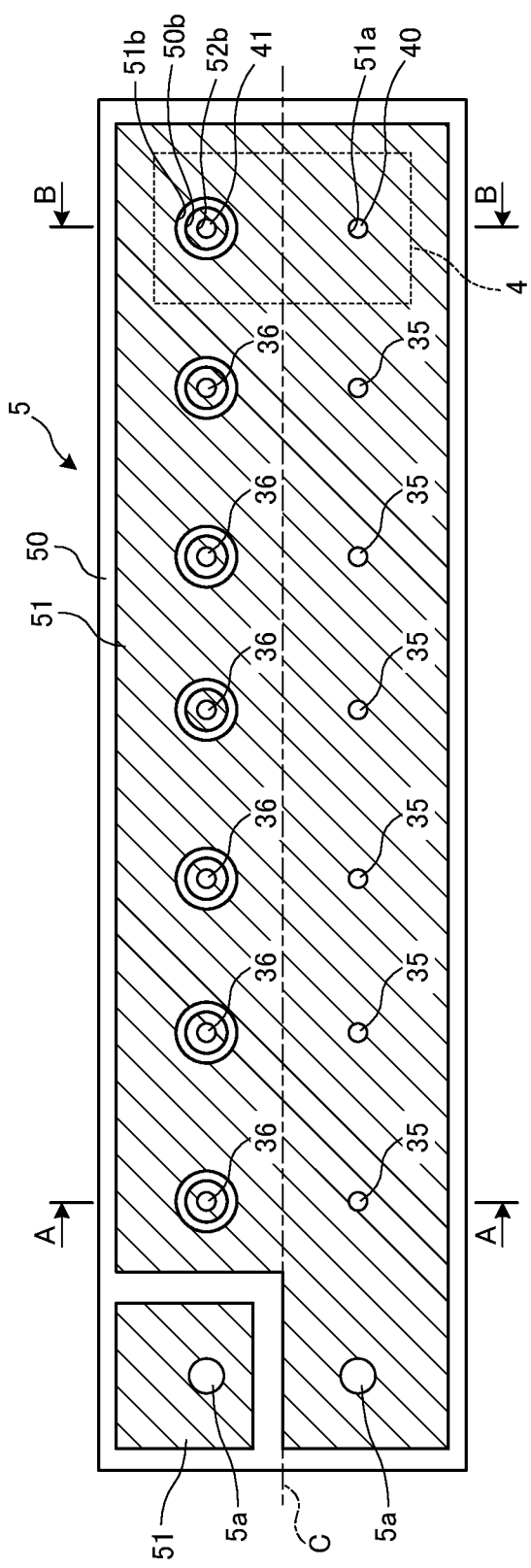
FIG. 5A and FIG. 5B are schematic views illustrating an example of a busbar according to the present embodiment.
Figure 5B:
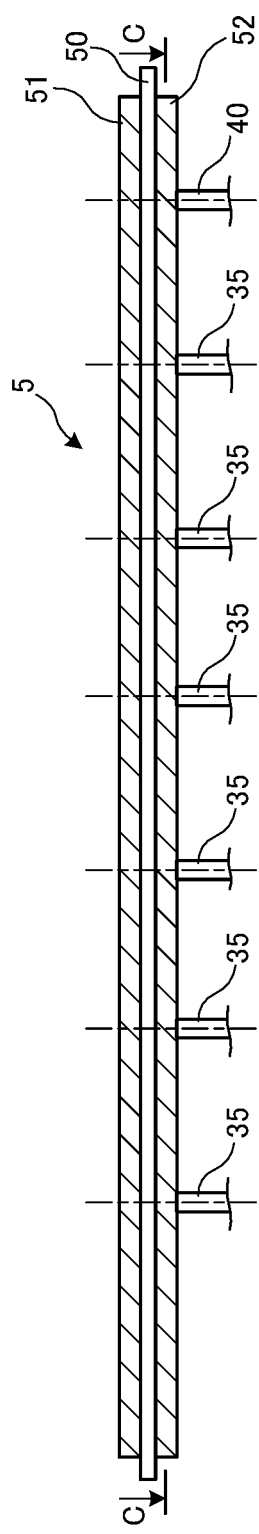
Figure 6A:
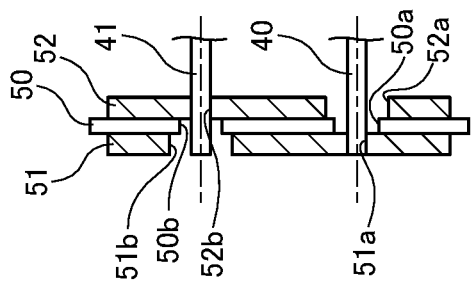
FIG. 6A through FIG. 6C are other schematic views illustrating the example of the busbar of the present embodiment.
Figure 6B:
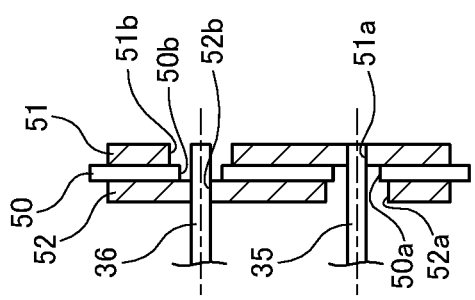
Figure 6C:
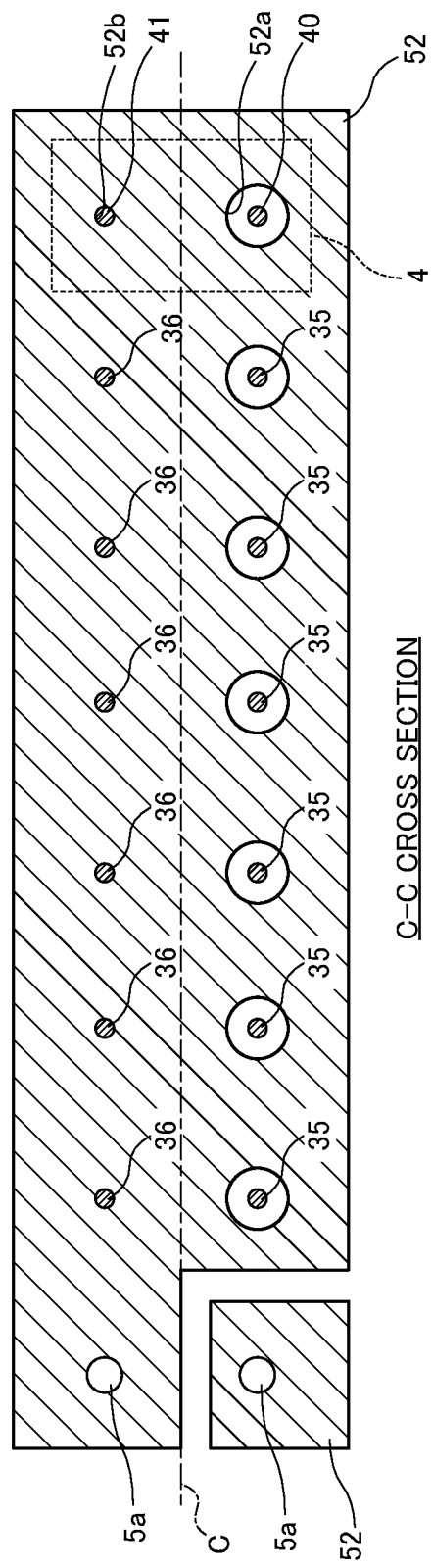

The following details, with reference to FIG. 2 through FIGS. 6A and 6B, a structure connecting the semiconductor modules, the capacitor, and the busbar according to the present embodiment. FIG. 4 illustrates the configuration of FIG. 1, omitting the control circuit board and the heat transfer component. FIGS. 5A and 5B, and FIGS. 6A-6C are schematic views illustrating an example of the busbar according to the present embodiment. FIG. 6A is an A-A sectional view illustrating the section along line A-A of the plan view of FIG. 5A, FIG. 6B is a B-B sectional view illustrating the section along line B-B of the plan view of FIG. 5A, and FIG. 6C is a C-C sectional view illustrating the section along line C-C of the side view of FIG. 5B.

First, detailed explanations will be given to the configuration of the busbar 5. As illustrated in FIG. 4, and FIGS. 5A and 5B, the first insulating layer 50 includes first through holes (first through holes) 50a piercing the first insulating layer 50 in the thickness direction at spots corresponding to the emitter-side connection terminals 35 (first connection terminals) and the third connection terminal 40, or specifically, at spots having their centers coinciding with those of the emitter-side connection terminals 35 and the third connection terminal 40 in a plane vision. The first insulating layer 50 includes second through holes (second through holes) 50b piercing the first insulating layer 50 in the thickness direction at spots corresponding to the collector-side connection terminals 36 (second connection terminals) and the fourth connection terminal 41, or specifically, at spots having their centers coinciding with those of the collector-side connection terminals 36 and the fourth connection terminal 41 in a plane vision. The first through holes 50a have an inner diameter greater than the outer diameter of the emitter-side connection terminals 35 or the third connection terminal 40 so as to allow passage of the emitter-side connection terminals 35 (third connection terminal 40). The second through holes 50b have an inner diameter greater than the outer diameter of the collector-side connection terminals 36 or the fourth connection terminal 41 so as to allow passage of the collector-side connection terminals 36 (fourth connection terminal 41). It is preferable that the first and second through holes 50a and 50b have an identical inner diameter. Employing an identical diameter for the first and second through holes 50a and 50b reduces the production steps.

The first busbar 51 includes third through holes 51a piercing the first busbar 51 in the thickness direction at spots corresponding to the emitter-side connection terminals 35 and the third connection terminal 40, or specifically, at spots having their centers coinciding with the emitter-side connection terminals 35 and the third connection terminal 40 in a plane vision. The first busbar 51 includes fourth through holes 51b piercing the first busbar 51 in the thickness direction at spots corresponding to the collector-side connection terminals 36 and the fourth connection terminal 41, or specifically, at spots having their centers coinciding with the collector-side connection terminals 36 and the fourth connection terminal 41 in a plane vision. The third through holes 51a have an inner diameter roughly identical to or somewhat smaller than the outer diameter of the emitter-side connection terminals 35 (third connection terminal 40). The fourth through holes 51b have an inner diameter greater than that of the second through holes 50b.

The second busbar 52 includes fifth through holes 52a piercing the second busbar 52 in the thickness direction at spots corresponding to the emitter-side connection terminals 35 and the third connection terminal 40, specifically, at spots having their centers coinciding with the emitter-side connection terminals 35 and the third connection terminal 40 in a plane vision. Also, the second busbar 52 includes sixth through holes 52b piercing the second busbar 52 in the thickness direction at spots corresponding to the collector-side connection terminals 36 and the fourth connection terminal 41, specifically, at spots having their centers coinciding with those of the collector-side connection terminals 36 and the fourth connection terminal 41 in a plane vision. The fifth through holes 52a have an inner diameter greater than that of first through holes 50a. The sixth through holes 52b have an inner diameter roughly identical to or somewhat smaller than the outer diameter of the collector-side connection terminals 36 (fourth connection terminal 41).

The busbar 5 is a rectangle in a plane vision that is long in the direction in which the three semiconductor modules 3 are arranged as described above, and includes two main surfaces (first busbar 51 and the second busbar 52) that are axially symmetric with respect to the center axis C in the longitudinal direction of the first insulating layer 50. That is, the first busbar 51 and the second busbar 52 are of shapes that are rotational symmetric with respect to the center axis C being an axis for the rotational symmetry. In other words, if the first busbar 51 is flipped upside down (rotated by 180 degree with respect to the center axis C), the shape of the first busbar 51 is identical to the shape of the second busbar 52. Also, the busbar 5 extends outwardly beyond the end opposite to the end with the supporting portion 61 of the heat transfer component 6, and includes a circular hole 5a for a main electrode terminal (P or N terminal). The circular hole 5a pierces the first insulating layer 50, the first busbar 51, and the second busbar 52 in their thickness direction.

The emitter-side connection terminals 35 and the third connection terminal 40 are press fit into the third through holes 51a made in the first busbar 51. Thereby, the first busbar 51 electrically connects the emitter-side connection terminals 35 and the third connection terminal 40. In this configuration, the inner walls (inner surfaces) of first through holes 50a are separated from the side walls (side surfaces or outer surfaces) of the emitter-side connection terminals 35 (third connection terminal 40). In other words, there is a first gap between the inner wall of the first through hole 50a and the outer surface of the emitter-side connection terminal 35. Further, the inner walls (inner surfaces) of the fifth through holes 52a are more separated from the side walls (side surfaces) of the emitter-side connection terminals 35 (third connection terminal 40) than are those of the first through holes 50a. In other words, the emitter-side connection terminals 35 (third connection terminal 40) are inserted into the first through holes 50a and the fifth through holes 52a with gaps (second gaps), and the gaps from the second busbar 52 are greater than those (first gaps) from the first insulating layer 50. This configuration facilitates the insertion of the emitter-side connection terminals 35 and the third connection terminal 40 into the third through holes 51a. Specifically, inserting the tip of each connection terminal just into third through hole 51a can ensure the conductivity. The configuration also eliminates the necessity of press fitting the connection terminals into the first insulating layer 50, preventing breakage of the first insulating layer 50, which is considered relatively brittle.

The collector-side connection terminals 36 and the fourth connection terminal 41 are press fit into the sixth through holes 52b made in the second busbar 52 so that their tips are inserted into the first busbar 51. Thereby, the second busbar 52 electrically connects the collector-side connection terminals 36 and the fourth connection terminal 41. In this configuration, the inner walls (inner surfaces) of the second through holes 50b are separated from the side walls (side surfaces) of the collector-side connection terminals 36 (fourth connection terminal 41). Further, the inner walls (inner surfaces) of the fourth through holes 51b are more separated from the side walls (side surfaces) of the collector-side connection terminals 36 (fourth connection terminals 41) than are those of the second through holes 50b. In other words, the collector-side connection terminals 36 (fourth connection terminal 41) are inserted into the second through holes 50b and the fourth through holes 51b with gaps, and the gaps from the first busbar 51 are greater than those from the first insulating layer 50.

This configuration facilitates the insertion of the collector-side connection terminals 36 and the fourth connection terminal 41 into the sixth through holes 52b. Specifically, inserting the tip of each connection terminal just into sixth through hole 52b can ensure the conductivity. The configuration also eliminates the necessity of press fitting the connection terminals into the first insulating layer 50, preventing breakage of the first insulating layer 50, which is considered relatively brittle.

It is also possible to employ a configuration in which the busbar 5 is set above the plurality of semiconductor modules 3, laser irradiation is provided from above to the areas (areas around the sixth through holes 52b) in contact with the collector-side connection terminals 36 of the second busbar 52 and the areas (areas around the third through holes 51a) in contact with the emitter-side connection terminals 35 of the first busbar 51, and thereby the upper and lower surfaces of the busbar 5 are irradiated with laser and welded only from the above.

Incidentally, semiconductor equipment used as an electric power conversion apparatus such as an inverter, which operates under an environment with high electric voltage and high electric current, may have heat in its semiconductor module. Such heat travels through an external connection terminal to reach the busbar terminals. The busbar terminals, influenced by Joule heat generated by a high current flowing through themselves, have more heat. This causes the heat travel from the busbar terminals to reach the control circuit board (gate drive circuit) close to the busbar terminal, which may cause failure in electronic components of the control circuit board. Also, a current-smoothing capacitor disposed close to a semiconductor module often suffers from relatively low heat resistance, making itself vulnerable to influence of the heat. Thus, a cooling mechanism is essential because heat that semiconductor equipment involves greatly affects the entire operation performance of the semiconductor equipment. Further, when the capacitor and the control circuit board are arranged close to each other, noise from the capacitor may exert influence on the control circuit board. This also leads to necessity of taking countermeasure against noise from the capacitor and the control circuit board.

In view of the above problems, the present inventors have emphasized the layout of semiconductor modules a capacitor, a busbar, and a control circuit board to achieve the present invention that can both improve the coolability of the semiconductor equipment and suppress noise between the capacitor and the control circuit board. Specifically, the present embodiment includes the semiconductor modules 3 and the capacitor 4 on the upper surface of the cooler 2, and also includes the busbar 5, the heat transfer component 6, and the control circuit board 7 stacked in this order starting from below above the semiconductor modules 3 and on the capacitor 4. The semiconductor modules 3 and the capacitor 4 have their lower surfaces in contact with the upper surface of the cooler 2. The semiconductor modules 3 and the busbar 5 are connected via the emitter-side connection terminals 35 and the collector-side connection terminals 36. Also, the capacitor 4 has its upper surface in contact with the lower surface (second busbar 52) of the busbar 5. The busbar 5 has its upper surface (first busbar 51) in contact with the lower surface (second insulating layer 63) of the heat transfer component 6. The heat transfer component 6 has its one end (lower end of the supporting portion 61) in contact with the upper surface of the cooler 2. The heat transfer component 6 has its upper surface (second insulating layer 63) in contact with the lower surface of the control circuit board 7.

This configuration, having the semiconductor modules 3 and the capacitor 4 in contact with the cooler 2, permits the cooler 2 to cool the semiconductor modules 3 and the capacitor 4. The heat of the semiconductor modules 3 travels through the emitter-side connection terminals 35 and the collector-side connection terminals 36 to reach the busbar 5 as well. The heat of the capacitor 4 also reaches the busbar 5 because they are in contact with each other. The heat of the busbar 5 travels to reach the heat transfer component 6 because they are in contact with each other. The heat transfer component 6, which has its one end in contact with the cooler 2, can be cooled (or can have the heat dissipated) by the cooler 2, and can in turn cool (dissipate the heat of) the busbar 5. The control circuit board 7 is in contact with the heat transfer component 6, and is opposite to the busbar 5 having the heat transfer component 6 between them. This arrangement not only causes the heat transfer component 6 to cool the control circuit board 7 but also reduces direct travel of the heat from the busbar 5 to the control circuit board 7. This suppresses increase in the temperature of the control circuit board 7.

The above configuration, where the heat transfer component 6 is disposed between the busbar 5, which generates heat, and the control circuit board 7, which should avoid being affected by the heat, and the heat transfer component 6 is directly connected to the cooler 2, can improve the coolability not only the control circuit board 7 but also components constituting the apparatus. Also, providing the heat transfer component 6 between the capacitor 4 and the control circuit board 7 can make the heat transfer component 6 function also as a barrier, leading to suppression of travel of noise between the capacitor 4 and the control circuit board 7.

Also, the two main surfaces (first busbar 51 and second busbar 52) of the busbar 5, which are axially symmetric with respect to center axis C in the longitudinal direction of the first insulating layer 50, permit the use of masks of an identical shape to form the first busbar 51 and the second busbar 52, reducing the production cost and production steps. Additionally, the busbar 5 can be mounted onto the semiconductor equipment 1 even when it is turned upside down or without considering the top and bottom surfaces of it, facilitating the assembly of the semiconductor equipment 1.

Figure 7:
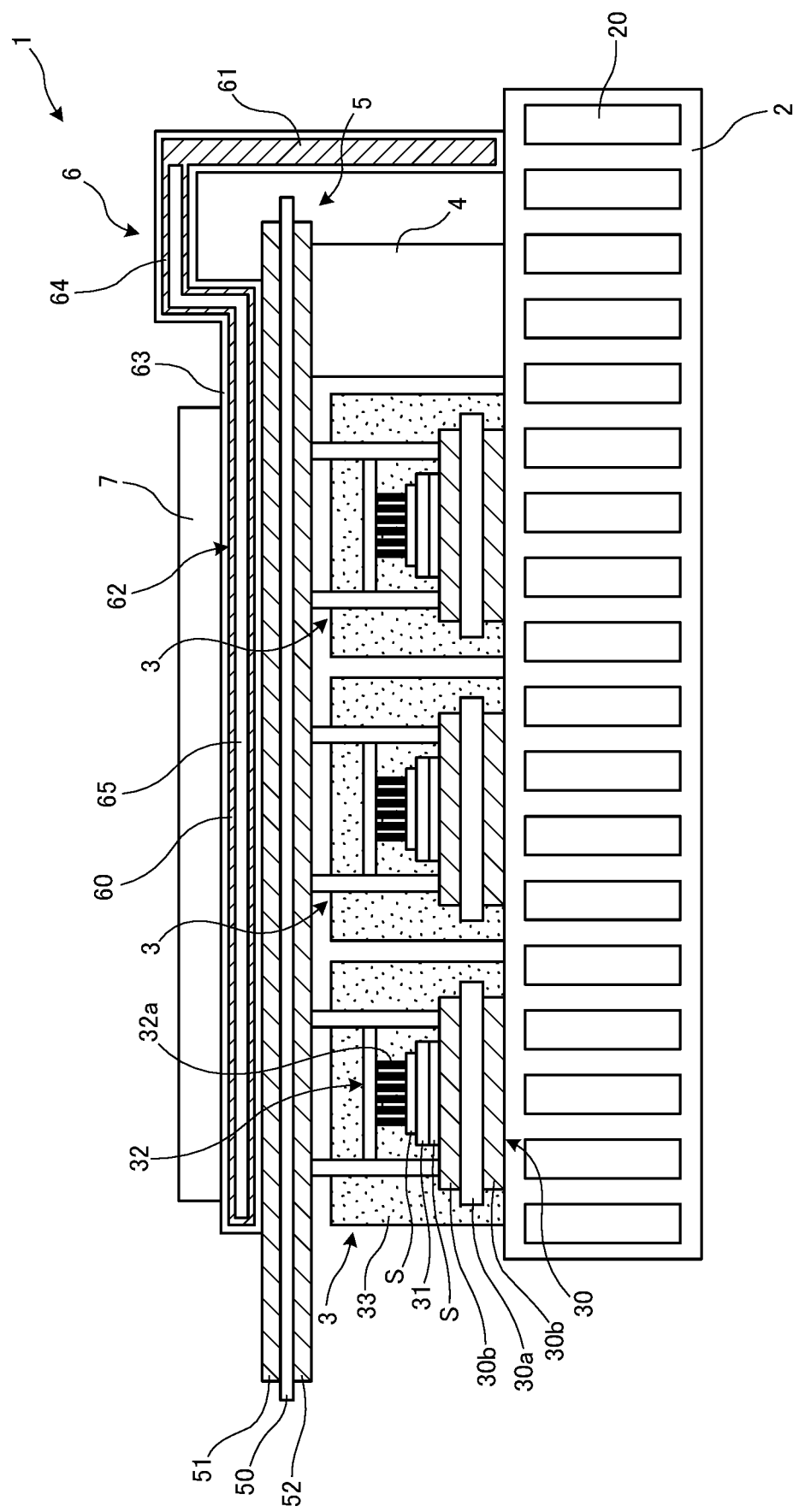
FIG. 7 is a schematic view illustrating semiconductor equipment according to the first variation example.
Figure 8:
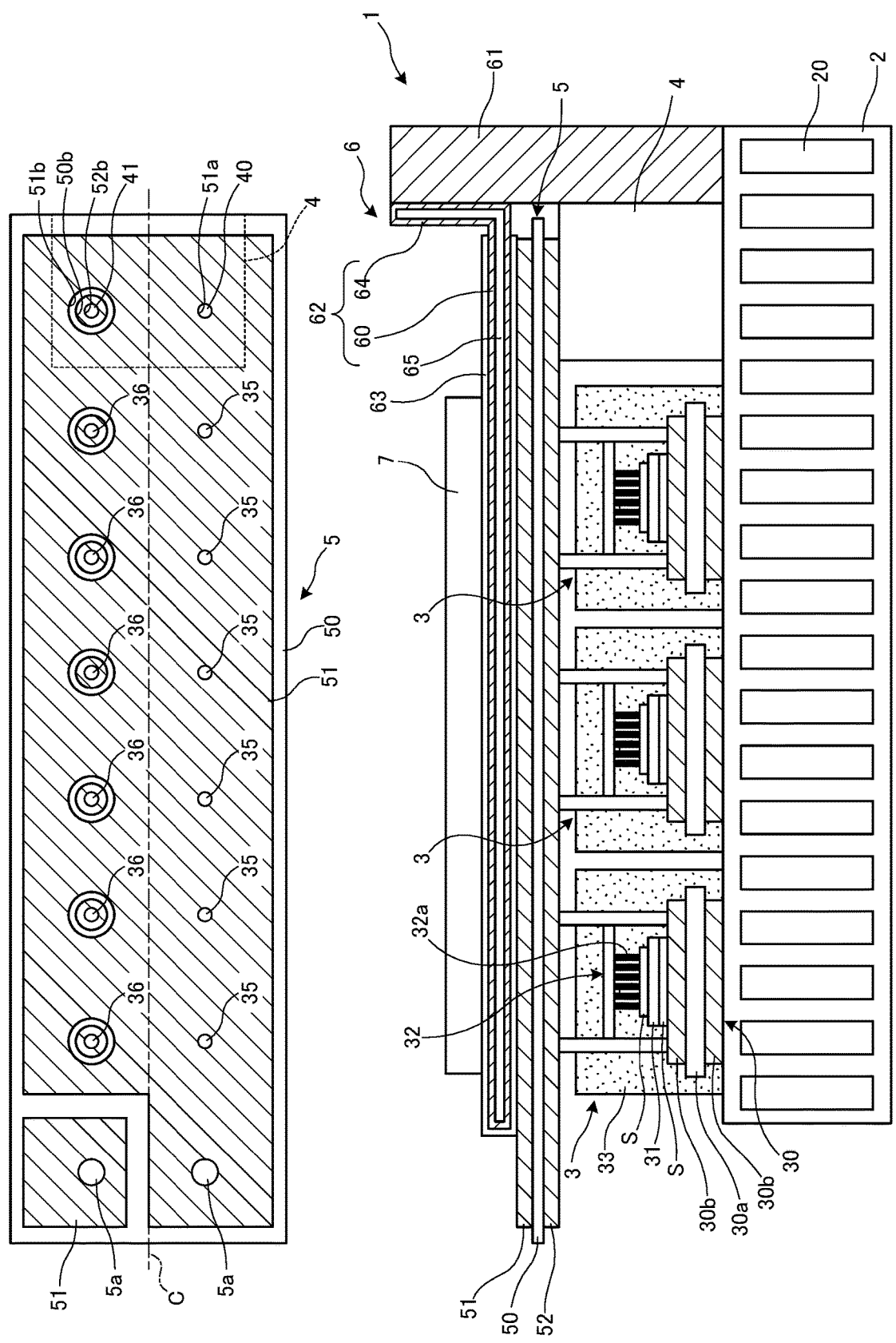
FIG. 8 is a schematic view illustrating semiconductor equipment according to the second variation example.

Note that while the heat transfer component 6 explained in the above embodiment is a solid flat plate having an even thickness, the scope of the present invention is not limited to this example. The configurations of FIG. 7 and FIG. 8 for example are also possible. FIG. 7 is a schematic view illustrating semiconductor equipment according to a first variation example, and FIG. 8 is a schematic view illustrating semiconductor equipment according to a second variation example.

First Variation Example

The configuration of FIG. 7 is different from that of FIG. 2 only in the shape of the heat transfer component 6. The heat transfer component 6 according to the first variation example includes a heat pipe sealing in a coolant. Specifically, the heat transfer component 6 includes the flat-plate portion 60 having the main body 62 in contact with the busbar 5 and the control circuit board 7, a cranked portion 64 that is continuous with the flat-plate portion 60 and is at a height greater than the surface of the flat-plate portion 60 facing the busbar 5, and the supporting portion 61 connected to the cranked portion 64. The cranked portion 64 includes a roughly vertical portion that starts from an end of the flat-plate portion 60, and also includes a portion that is cranked to extend horizontally and outward so as to form an L shape when seen from side. The supporting portion 61 extends downward from the outer end of the cranked portion 64 so as to be in contact with the upper surface of the cooler 2. The flat-plate portion 60 and the cranked portion 64 are hollow and contains an L-shaped coolant channel 65 running across them. The coolant channel 65 seals in the coolant in a gas phase and/or a liquid phase. The supporting portion 61 is solid. Specifically, the coolant channel 65 is made vacuum, and thereafter a small amount of a liquid (coolant) is sealed in. The liquid absorbs heat of the busbar 5 that has reached the heat transfer component 6, and transitions to vapors. The supporting portion 61, which is cooled by the cooler 2, has a temperature lower than that of the flat-plate portion 60 or the cranked portion 64. The pressure difference conveys the vapors from the flat-plate portion 60 toward the cranked portion 64, which has a lower temperature. In the cranked portion 64, the vapors release their heat to the supporting portion 61, and transition back to liquid. Then, the liquidized coolant goes back to the flat-plate portion 60, which has a higher temperature. This return is caused by the gravity or a wick (not illustrated) with a capillary force provided in the flat-plate portion 60 and the cranked portion 64. Repetition of this cycle transfers the heat. This configuration where the heat transfer component 6 includes a heat pipe that seals in a coolant can increase the heat transfer efficiency (heat dissipation efficiency), leading to even higher coolability of the apparatus. Also, forming the coolant channel 65 only in the flat-plate portion 60 and the cranked portion 64 can effectively accelerate phase transition of the coolant without hindering the flow of the coolant and can also increase the heat transfer efficiency. Thereby, the heat pipe with the bending portion 64 can convey more heat. The coolant channel 65 may form circulation with a heat pipe.

Second Variation Example

The configuration of FIG. 8 is different from those of FIG. 2 and FIG. 7 in the shape of the heat transfer component 6. The heat transfer component 6 of the second variation example includes a heat pipe and also includes the cranked portion 64 that extends vertically upward. Also, the supporting portion 61 extends upward from the cooler 2 to come in contact with a side surface of the cranked portion 64. A side surface of the supporting portion 61 is in contact with a side surface of the capacitor 4 in addition to the side surface of the cranked portion 64. Thus increased area that is in contact with the cooler 2 achieves higher coolability through the contact with the cooler 2.

The heat pipes of FIGS. 6A-6C and FIG. 7 may be formed of a single flat plate, or a plurality of narrow pipes may be arranged in the lateral direction of the busbar 5 to form one heat transfer component 6.

In the above embodiment, two insulating circuit substrates 30 and two semiconductor chips are provided to each of the semiconductor modules 3, whereas the scope of the present invention is not limited to this configuration. Any numbers (including one, and three or more) of the insulating circuit substrates 30 and the semiconductor chips 31 may be may be used, and appropriate changes can be made to the arranging methods (orientations) of them. Appropriate changes can also be made to the number of the semiconductor modules 3 and the directions of their arrangement.

Appropriate changes can also be made to materials for components constituting the semiconductor equipment 1 in the above embodiment and examples. For example, materials other than a polyimide resin can also be used for insulation, and various metal materials other than copper, aluminum, or a metal containing at least one of them can also be used as a metal material.

While explanations have been given to the present embodiment and the variation examples, full or partial combinations of the present embodiment and the variation examples may constitute additional embodiments.

The present embodiment is not limited to the above embodiment or variation examples, but allows various modifications, substitutions, and alterations without departing from the spirit of the technical concept. Further, the present embodiment may be implemented by any other methods that are based on potential technical advance or based on a derivative technique capable of embodying the technical concept. The scope of the claims, therefore, encompasses all embodiments that can fall within the scope of the technical concept.

The following lists the features of the above embodiment. The semiconductor equipment according to the above embodiment is semiconductor equipment including a plurality of semiconductor modules sealed with a resin, each semiconductor module having an upper surface and a lower surface, and including a first connection terminal and a second connection terminal that are exposed from the resin at the upper surface thereof; a capacitor including a third connection terminal and a fourth connection terminal, the capacitor having an upper surface and a lower surface; a cooler directly contacting the lower surface of each semiconductor module and the lower surface of the capacitor; a busbar including a first insulating layer having an upper surface and a lower surface, a first busbar having an upper surface and a lower surface, and being disposed on the upper surface of the first insulating layer, and a second busbar having an upper surface and a lower surface, and being disposed on the lower surface of the first insulating layer, wherein the first busbar connects the first connection terminal to the third connection terminal, the second busbar connects the second connection terminal to the fourth connection terminal, and the upper and lower surfaces of the first busbar and the upper and lower surfaces of the second busbar are at least partially parallel to each other; a control circuit board configured to control the semiconductor modules; and a heat transfer component including a main body having an upper surface and a lower surface, and being connected to the cooler, and a second insulating layer disposed on at least apart of the lower surface of the main body so that the lower surface of the main body is in contact with the busbar via the second insulating layer, and disposed on at least a part of the upper surface of the main body so that the upper surface of the main body is in contact with the control circuit board via the second insulating layer.

In the semiconductor equipment according to the above embodiment, the first insulating layer includes a first through hole through which the first connection terminal passes and a second through hole through which the second connection terminal passes, a first gap being formed between an inner wall of the second through hole and an outer surface of the second connection terminal, and the first busbar has an other through hole through which the second connection terminal passes, a second gap being formed between an inner wall of the other through hole and the outer surface of the second connection terminal, the second gap being greater than the first gap.

In the semiconductor equipment according to the above embodiment, the plurality of semiconductor modules are aligned in a first direction, the busbar is of a rectangle shape of which a first side is in a direction parallel to the first direction and a second side is shorter than the first side and in a direction orthogonal to the first direction, a center axis of the busbar being in a direction parallel to the first direction, and the first busbar and the second busbar are of shapes in a plan view of the apparatus that are rotational symmetric to each other, with the center axis of the busbar being axis for the rotational symmetry.

In the semiconductor equipment according to the above embodiment, the first busbar and a second busbar each include plurality through holes, and the first connection terminal and the third connection terminal are respectively pressed fit into the through holes in the first busbar, and the second connection terminal and the fourth connection terminal are respectively pressed fit into the through holes in the second busbar.

In the semiconductor equipment according to the above embodiment, each of the first insulating layer and the second insulating layer includes a polyimide resin.

In the semiconductor equipment according to the above embodiment, the upper surface of the capacitor is in direct contact with the second busbar.

In the semiconductor equipment according to the above embodiment, the heat transfer component includes a metal containing copper or aluminum.

In the semiconductor equipment according to the above embodiment, the heat transfer component includes a heat pipe sealing in a coolant that cools the busbar through phase transition.

In the semiconductor equipment according to the above embodiment, the heat transfer component includes a flat-plate portion, a cranked portion, and a supporting portion, the flat-plate portion having an upper surface and a lower surface, the lower surface of the flat-plate portion being in contact with the busbar and the upper surface of the flat-plate portion being in contact with the control circuit board, the cranked portion is connected to the flat-plate portion and has a lower surface spaced from the busbar at a side opposite to a side at which the cooler is disposed, and the supporting portion is connected to the cranked portion.

In the semiconductor equipment according to the above embodiment, the flat-plate portion and the cranked portion are hollow and sealed in the coolant in a gas phase, a liquid phase, or gas and liquid phases and the supporting portion is solid.

INDUSTRIAL APPLICABILITY

The present invention, as described above, brings about an effect of improving the coolability and suppressing influence of noise, and is advantageous in particular for semiconductor equipment used as an electric power conversion apparatus such as an inverter etc.

EXPLANATIONS OF LETTERS OR NUMERALS

1: SEMICONDUCTOR EQUIPMENT
2: COOLER
3: SEMICONDUCTOR MODULE
4: CAPACITOR
5: BUSBAR
5A: CIRCULAR HOLE
6: HEAT TRANSFER COMPONENT
7: CONTROL CIRCUIT BOARD
20: COOLING-WATER CHANNEL
22: LONGITUDINAL WALL
30: INSULATING CIRCUIT SUBSTRATE
30A: INSULATING LAYER
30B: METAL LAYER
31: SEMICONDUCTOR CHIP
32: PRINTED CIRCUIT BOARD
32A: PIN
34: OUTPUT TERMINAL
35: EMITTER-SIDE CONNECTION TERMINAL
36: COLLECTOR-SIDE CONNECTION TERMINAL
37: GATE SIGNAL TERMINAL
38: EMITTER SIGNAL TERMINAL
40: THIRD CONNECTION TERMINAL
41: FOURTH CONNECTION TERMINAL
50: FIRST INSULATING LAYER
50A: FIRST THROUGH HOLE
50B: SECOND THROUGH HOLE
51: FIRST BUSBAR
51A: THIRD THROUGH HOLE
51B: FOURTH THROUGH HOLE
52: SECOND BUSBAR
52A: FIFTH THROUGH HOLE
52B: SIXTH THROUGH HOLE
60: FLAT-PLATE PORTION
61: SUPPORTING PORTION
62: MAIN BODY
63: SECOND INSULATING LAYER
64: CRANKED PORTION
65: COOLANT CHANNEL
C: CENTRAL AXIS
S: SOLDER

What is claimed is:
1. Semiconductor equipment, comprising:
a plurality of semiconductor modules sealed with a resin, each semiconductor module having an upper surface and a lower surface, and including a first connection terminal and a second connection terminal that are exposed from the resin at the upper surface thereof;
a capacitor including a third connection terminal and a fourth connection terminal, the capacitor having an upper surface and a lower surface;
a cooler directly contacting the lower surface of each semiconductor module and the lower surface of the capacitor;
a busbar including
a first insulating layer having an upper surface and a lower surface,
a first busbar having an upper surface and a lower surface, and being disposed on the upper surface of the first insulating layer, and
a second busbar having an upper surface and a lower surface, and being disposed on the lower surface of the first insulating layer, wherein
the first busbar connects the first connection terminal to the third connection terminal,
the second busbar connects the second connection terminal to the fourth connection terminal, and
the upper and lower surfaces of the first busbar and the upper and lower surfaces of the second busbar are at least partially parallel to each other;
a control circuit board configured to control the semiconductor modules; and
a heat transfer component including
a main body having an upper surface and a lower surface, and being connected to the cooler, and
a second insulating layer disposed on at least a part of the lower surface of the main body so that the lower surface of the main body is in contact with the busbar via the second insulating layer, and disposed on at least a part of the upper surface of the main body so that the upper surface of the main body is in contact with the control circuit board via the second insulating layer.

2. The semiconductor equipment according to claim 1, wherein
the first insulating layer includes a first through hole through which the first connection terminal passes and a second through hole through which the second connection terminal passes, a first gap being formed between an inner wall of the second through hole and an outer surface of the second connection terminal, and
the first busbar has an other through hole through which the second connection terminal passes, a second gap being formed between an inner wall of the other through hole and the outer surface of the second connection terminal, the second gap being greater than the first gap.

3. The semiconductor equipment according to claim 1, wherein
the plurality of semiconductor modules are aligned in a first direction,
the busbar is of a rectangle shape of which a first side is in a direction parallel to the first direction and a second side is shorter than the first side and in a direction orthogonal to the first direction, a center axis of the busbar being in a direction parallel to the first direction, and the first busbar and the second busbar are of shapes in a plan view of the apparatus that are rotational symmetric to each other, with the center axis of the busbar being axis for the rotational symmetry.

4. The semiconductor equipment according to claim 1, wherein
the first busbar and a second busbar each include plurality through holes, and
the first connection terminal and the third connection terminal are respectively pressed fit into the through holes in the first busbar, and the second connection terminal and the fourth connection terminal are respectively pressed fit into the through holes in the second busbar.

5. The semiconductor equipment according to claim 1, wherein each of the first insulating layer and the second insulating layer includes a polyimide resin.

6. The semiconductor equipment according to claim 1, wherein the upper surface of the capacitor is in direct contact with the second busbar.

7. The semiconductor equipment according to claim 1, wherein the heat transfer component includes a metal containing copper or aluminum.

8. The semiconductor equipment according to claim 1, wherein the heat transfer component includes a heat pipe sealing in a coolant that cools the busbar through phase transition.

9. The semiconductor equipment according to claim 8, wherein
the heat transfer component includes a flat-plate portion, a cranked portion, and a supporting portion,
the flat-plate portion having an upper surface and a lower surface, the lower surface of the flat-plate portion being in contact with the busbar and the upper surface of the flat-plate portion being in contact with the control circuit board,
the cranked portion is connected to the flat-plate portion and has a lower surface spaced from the busbar at a side opposite to a side at which the cooler is disposed, and
the supporting portion is connected to the cranked portion.

10. The semiconductor equipment according to claim 9, wherein
the flat-plate portion and the cranked portion are hollow and sealed in the coolant in a gas phase, a liquid phase, or gas and liquid phases and
the supporting portion is solid.

* * * * *